United States Patent [19]
Das et al.

[11] Patent Number: 6,141,081
[45] Date of Patent: Oct. 31, 2000

[54] STEPPER OR SCANNER HAVING TWO ENERGY MONITORS FOR A LASER

[75] Inventors: Palash P. Das, Vista; Igor V. Fomenkov, San Diego, both of Calif.

[73] Assignee: Cymer, Inc., San Diego, Calif.

[21] Appl. No.: 08/908,862

[22] Filed: Aug. 8, 1997

[51] Int. Cl.[7] .......................... G03B 27/42; G03B 27/74; G03C 5/00; G21G 5/00
[52] U.S. Cl. ............................. 355/53; 355/68; 430/30; 250/492.1
[58] Field of Search ................... 355/53, 67, 68, 355/69, 50, 43, 71, 77; 356/121, 401, 399, 400, 53, 67, 68, 69, 50, 43, 71, 77; 430/30, 311; 250/492.1

[56] References Cited

U.S. PATENT DOCUMENTS

| | | | |
|---|---|---|---|
| 4,641,071 | 2/1987 | Tazawa et al. | 318/640 |
| 5,463,650 | 10/1995 | Ito et al. | 372/57 |
| 5,526,093 | 6/1996 | Takahashi | 355/53 |
| 5,657,334 | 8/1997 | Das et al. | 372/33 |
| 5,659,383 | 8/1997 | Ozawa | 355/53 |
| 5,721,608 | 2/1998 | Taniguchi | 355/53 |
| 5,726,739 | 3/1998 | Hayata | 355/67 |
| 5,728,495 | 3/1998 | Ozawa | 430/30 |

FOREIGN PATENT DOCUMENTS 08274399  10/1996  Japan.

OTHER PUBLICATIONS

Kazuaki Suzuki et al., "Dosage Control For Scanning Exposure with Pulsed Energy Fluctuation and Exposed Position Jitter," Jpn. J. Appl. Phys., vol. 34 (1995), pp. 6565–6572.

G. de Zwart et al., "Performance of A Step And Scan System For DUV Lithography," SPIE Symposium on Optical Microlithography, Santa Clara, Mar. 1997, pp. 1–19.

*Primary Examiner*—Russell Adams
*Assistant Examiner*—Peter B. Kim
*Attorney, Agent, or Firm*—Brian D. Ogonowsky, Esq.

[57] ABSTRACT

A first laser light intensity detector is positioned within a stepper or scanner proximate to a reticle so that attenuation due to stepper optics has already occurred prior to the laser light impinging upon the light intensity detector. Preferably, the first light intensity detector is mounted as closed to the wafer as practical. A second light intensity detector is located at the output of the laser. The light intensity detected from the outputs of the first and second light intensity detectors, in conjunction, forms part of a feedback mechanism which adjusts the light output of the laser, during wafer fabrication, so that the light intensity detected by the first light intensity detector is an optimum value.

20 Claims, 5 Drawing Sheets

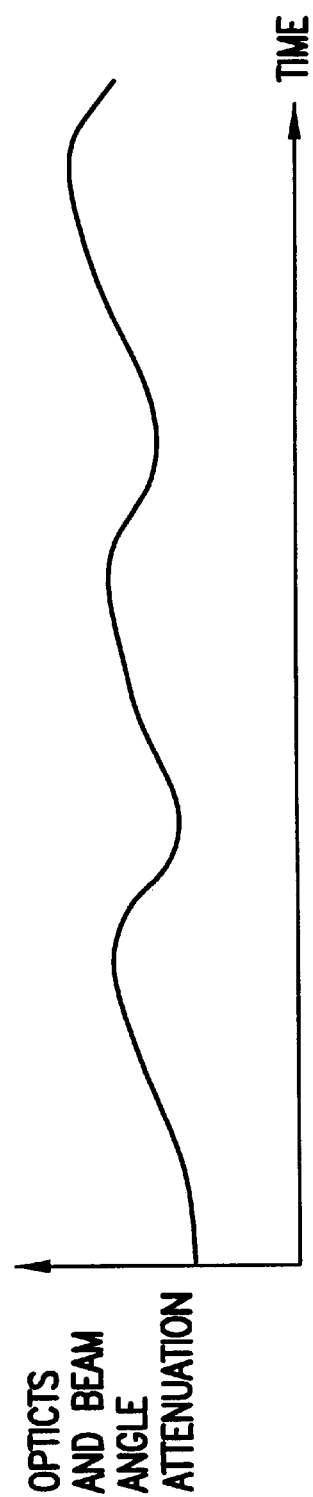

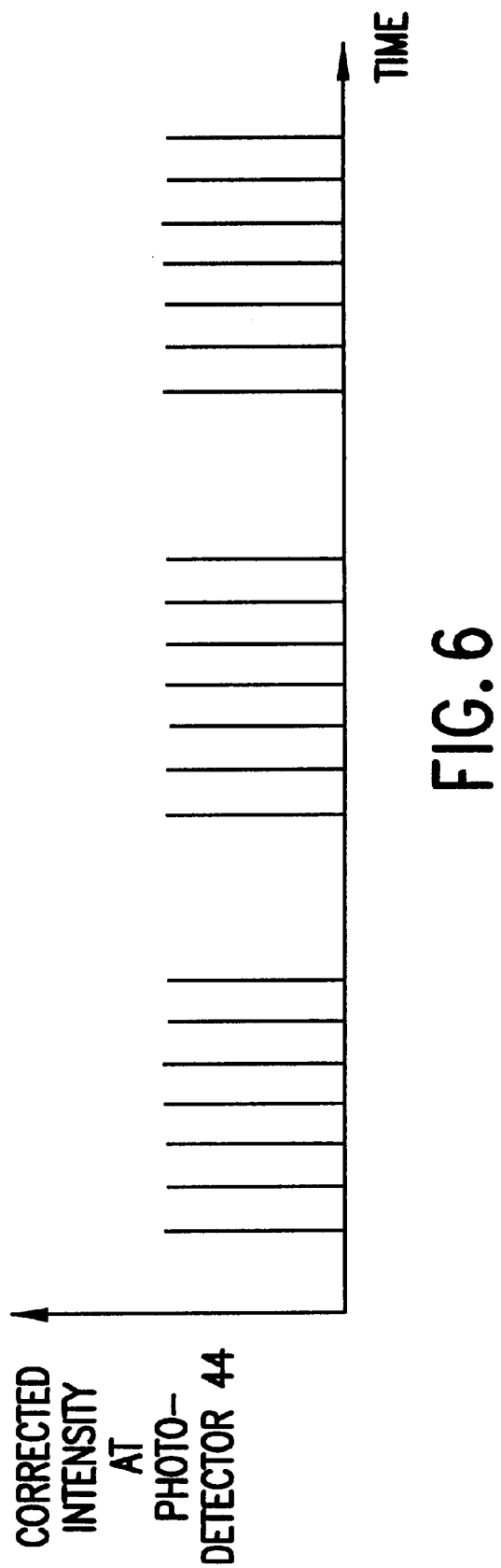

STEPPER OR SCANNER HAVING TWO ENERGY MONITORS FOR A LASER

FIELD OF THE INVENTION

This invention relates to steppers or scanners for wafer fabrication using a laser as a light source and, in particular, to a technique for monitoring the energy of a laser when used with a stepper, a scanner, or a step-and-scan system.

BACKGROUND

Conventional lasers frequently incorporate a light energy monitor proximate to the laser for monitoring the intensity of the laser light. One such system is described in U.S. Pat. No. 5,450,207, entitled "Method and Apparatus for Calibrating a Laser Wavelength Control Mechanism" by Igor Formenkov, assigned to the present assignee and incorporated by reference. Typically, the light energy monitor is a photodetector which produces an output current proportional to the light intensity impinging on the photodetector.

Lasers are frequently used in semiconductor wafer fabrication systems to selectively expose a layer of photoresist on the wafer. A mask (or reticle) is interposed between the laser light and the wafer to allow the selective exposure. State of the art exposure systems step or scan the light exposure pattern over the wafer surface and include a relatively complex optical system to direct the laser radiation onto the wafer surface.

The amount of light required to adequately expose the photoresist during a step or scan is a product of the light intensity and the length of time that the light impinges upon the wafer. Accordingly, the intensity of light must be known accurately in order to determine the required duration of the light impinging on the wafer. Typically, the laser light is generated in pulses, and the number of pulses needed to adequately expose the photoresist is determined based upon the intensity of the laser light. Due to variations in the pulse energy, the number of pulses in a single exposure is usually large (e.g., greater than 20) so that variations in individual pulses do not significantly affect the total exposure energy.

Applicants have discovered that the stepper or scanner optics give rise to fairly unpredictable attenuation of the laser light intensity impinging upon the wafer. Since the light intensity detector is located near the laser output, there is no way to take into account any unpredictable light attenuation by the stepper or scanner optics. Accordingly, the actual light intensity impinging upon the wafer is not known, and the wafer processing system is not optimized.

The above-described problem is more significant when a large excimer laser system is used in conjunction with a stepper or scanner, since the laser system is typically physically spaced from the stepper or scanner by a number of meters and requires additional beam steering optics.

SUMMARY

In one embodiment, in addition to incorporating a light intensity detector within a laser system used for wafer fabrication, Applicants also incorporate a second light intensity detector within the stepper or scanner itself so that attenuation due to the stepper or scanner optics, or due to a beam angle change, has already occurred prior to the laser light impinging upon the second light intensity detector. Preferably, the second light intensity detector is mounted as closed to the wafer as practical.

The two light intensity detectors form part of a feedback mechanism which adjusts the light output of the laser so that the light intensity during a pulse incident upon the wafer is of an optimum value. The light intensity signals from the first and second detectors convey different information: the detector in the laser system is used to convey information regarding the output of the laser, and the detector in the stepper/scanner is used to convey information regarding the optics in the scanner/stepper. The use of both detectors enables more precise adjustment of the laser beam characteristics to provide a more uniform energy per pulse. Thus, fewer pulses may be used in the exposure process.

This technique may be used in wafer fabrication systems other than steppers or scanners.

BRIEF DESCRIPTION OF THE DRAWINGS

FIG. 4 illustrates the changes in laser pulse energy from pulse to pulse within a burst and from burst to burst, prior to correction, as measured by the laser monitor.

FIG. 5 illustrates the changes in optics attenuation due to heating, beam angle changes, and other causes.

FIG. 6 illustrates the corrected pulse intensity as measured by the photodetector in the stepper/scanner.

DETAILED DESCRIPTION OF THE PREFERRED EMBODIMENT

Figure 1:
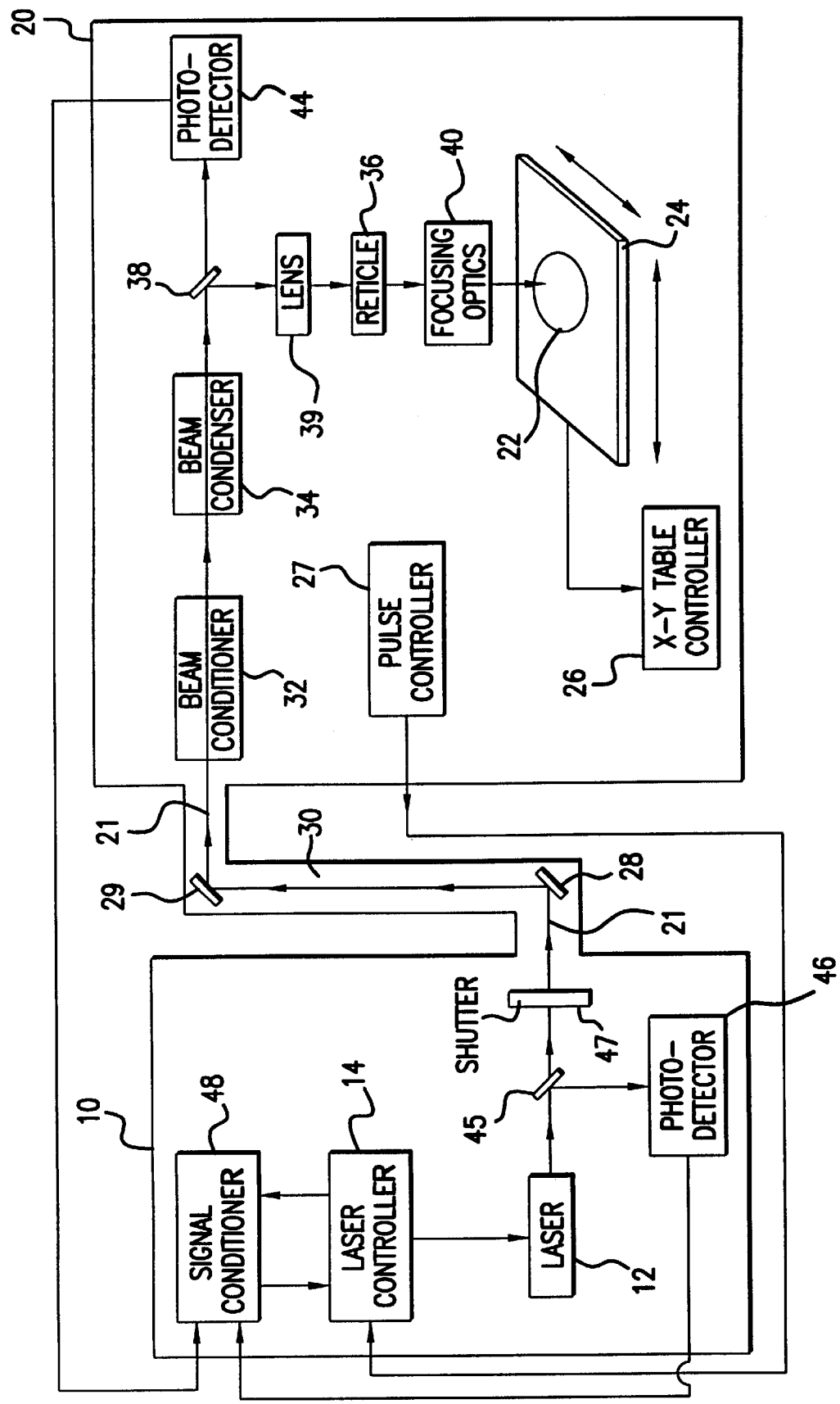
FIG. 1 illustrates a laser system and a stepper/scanner exposure system modified to include a light intensity monitor proximate to the wafer and a light intensity monitor in the laser system.

FIG. 1 illustrates a wafer processing apparatus incorporating the present invention.

In FIG. 1, an excimer laser system 10 contains an excimer laser excitation chamber, identified as laser 12, and various feedback control circuits and mechanisms to adjust the wavelength, spectral width, intensity, and burst duration of laser light emitted from the laser system 10. These control circuits and mechanisms are shown as laser controller 14. Methods and structures for tuning a laser, controlling its intensity, and controlling the pulses of laser light are well known, and any suitable method may be used for controlling the laser output of laser system 10.

A stepper, scanner, or step-and scan system (collectively referred to as stepper 20) receives a laser beam 21 from laser system 10 and ultimately focuses a mask pattern onto a semiconductor wafer 22 for exposing a layer of photoresist on wafer 22. After a predetermined number of pulses of laser light, or after a scan, wafer 22 is stepped in an X and/or Y direction by an X-Y table 24. A controller 26 controls the position of the X-Y table 24 in response to a software routine after each exposure of wafer 22. A pulse controller 27 provides signals to laser system 10 to generate a predetermined number of pulses during each step of wafer 22. A keyboard and computer (not shown) forming part of stepper 20 may be used to program controllers 26 and 27 for automatic processing of wafer 22.

The excimer laser system 10 is typically manufactured as an independent unit, and it is not known beforehand precisely how the light output of the laser system 10 will be affected by the stepper optics.

The laser beam 21 output by the laser system 10 is directed by mirrors 28 and 29 within a nitrogen-filled conduit 30 to a light input port of stepper 20. Nitrogen is used to prevent moisture from entering conduit 30 and attenuating the laser light propagating through conduit 30.

Beam conditioner optics 32 and beam condenser optics 34 alter the beam 21, as required, prior to its application to a reticle 36 containing one or more mask patterns. The beam conditioning optics 32 may include a series of lenses (forming a homogenizer) to average the spatial intensity of the laser beam 21 over the area of the beam. Such a homogenizer may use a two dimensional array of small lenses followed by a second lens to average the light outputs of the small lenses. The conditioner optics 32 and condenser optics 34 may also expand the beam, as necessary, to form a square beam. Such optics 32 and 34 may be conventional.

A half-silvered mirror 38, and possibly other optics if needed, redirects the beam through lens 39 onto reticle 36. The mask pattern on reticle 36 is typically chrome or other opaque material formed in a pattern to be replicated in the photoresist on the surface of wafer 22.

Focusing optics 40 focus the light passing through reticle 36 onto a small area of wafer 22. If stepper 20 is a scanner, a conventional scanning system is employed to scan reticle 36 and wafer 22 with respect to a narrow strip of light exiting lens 39. Additional beam steering and shaping optics may also be incorporated in stepper 20.

A small percentage of the light impinging upon the half-silvered mirror 38 is received by a photodetector 44, which may be any conventional photodetector. One suitable type of photodetector consists of an array of photodiodes whose current output is proportional to the light intensity impinging on the photodiodes after subtracting a DC offset. Such photodetector arrays are well known.

A similar mirror 45 and photodetector 46 is used to measure the beam 21 intensity at the laser 12 output.

A conventional shutter 47 controllably blocks beam 21 from entering stepper 20 and is located downstream from mirror 45.

The X-Y table controller 26 is programmed to step wafer 22 to a next position after a predetermined number of pulses of laser energy, typically having a predetermined wavelength and pulse width. If system 20 is a scanner, the wafer 22 and reticle 36 are scanned relative to the light before stepping. The number of pulses is calculated based upon the required total energy of light impinging on the wafer during a step or during scanning. This requires an accurate determination of the light energy and pulse width. Previous laser systems and steppers/scanners, to Applicants' knowledge, do not provide for a laser light intensity measuring device within the laser and within the stepper/scanner itself, to be used in conjunction with one another, when the laser system is located external to the stepper.

An excimer laser, including its power supply, control circuits, and cooling system, is a relatively large device external to the stepper. Since the attenuation provided by the various optics in stepper 20 may change during use, the number of pulses generated by the laser system 10 for a particular step or scan may undesirably be more than or fewer than that which is optimally needed to expose the photoresist on wafer 22. By locating the photodetector 44 after the stepper optics that cause attenuation of concern and prior to reticle 36, any attenuation or distortion by the stepper optics is automatically taken into account when adjusting the light intensity of the laser output. However, using photodetector 44 alone cannot identify whether the cause of any energy transients is due to the optics or due to the laser system 10 itself.

Photodetector 46 in the laser system 10 is used for identifying those energy transients solely due to the laser system 10. As will be seen, the use of photodetectors 44 and 46, in conjunction, creates a synergistic effect to greatly improve the uniformity of pulse energy incident upon reticle 36.

Many other optical arrangements may be used to provide the laser light to reticle 36, photodetector 44, and photodetector 46, and such arrangements may be equally suitable to achieve the benefits of the present invention. For example, an optical arrangement in which there are no optical elements between photodetector 44 and reticle 36 may be equally suitable.

Figure 2:
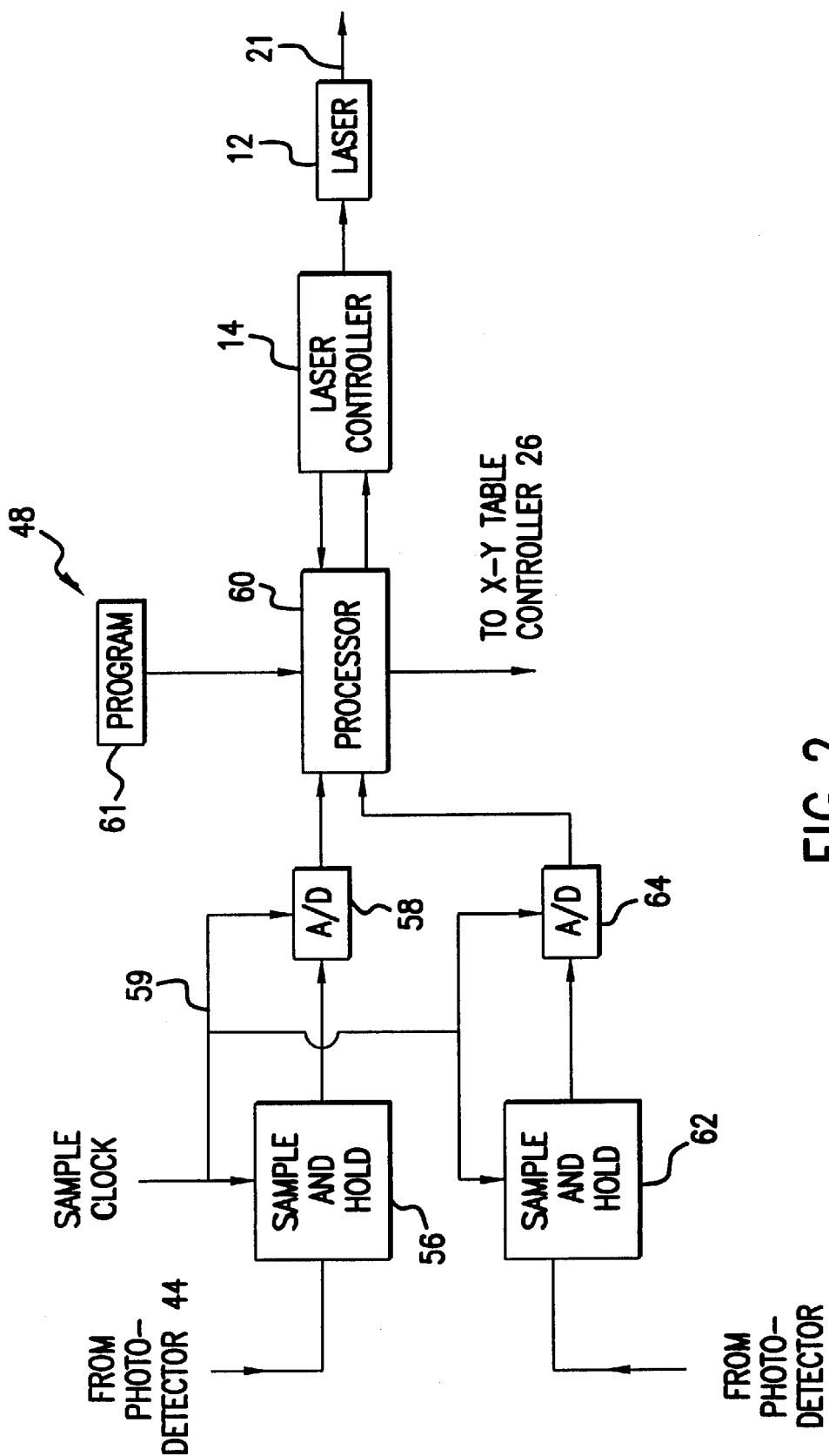
FIG. 2 generally illustrates the feedback system used for adjusting the laser output.

In FIG. 2, a signal conditioner 48 (e.g., a programmed processor) located in either stepper 20 or laser system 10 receives the signals from photodetectors 44 and 46, as well as other information regarding the timing of laser pulses and bursts, and processes the outputs of photodetectors 44 and 46 to generate laser output compensation signals. Such signals are further processed by circuitry in the laser controller 14 to control the operating voltage of laser 12 in order to modify the laser output. This process is described in greater detail below.

Figure 3:
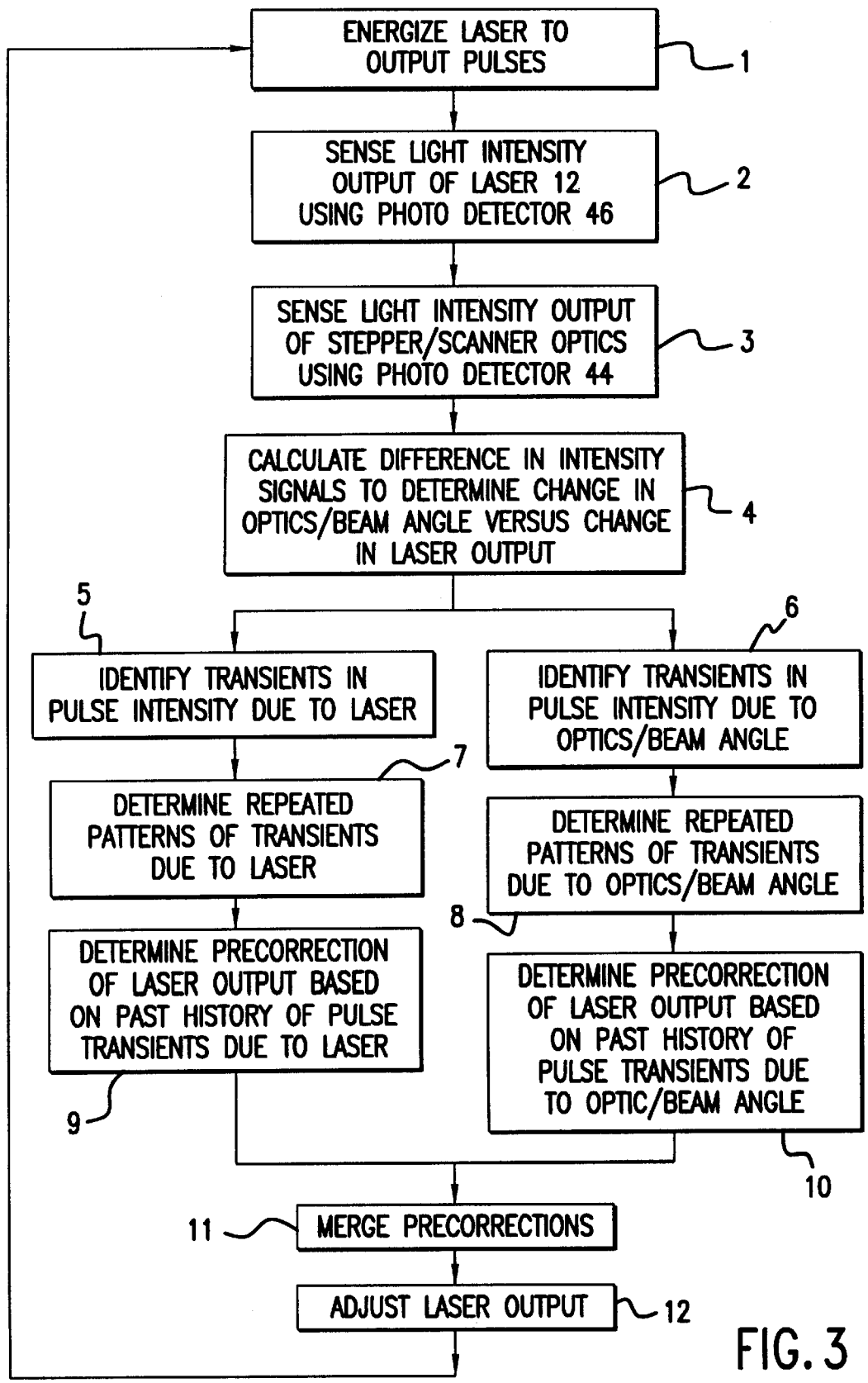
FIG. 3 is a flowchart showing the use of the signals from the two detectors in controlling the laser output.

FIG. 2 generally illustrates the feedback circuitry within the laser system 10 for controlling the intensity of laser light during each pulse and for adjusting other characteristics of the laser if desired. FIG. 3 is a flowchart illustrating the basic steps used by the feedback circuitry.

The signal from photodetector 44 in stepper 20 is typically an analog signal. This signal is first integrated and sampled using a sample and hold circuit 56 so as to effectively obtain a snapshot of the light intensity during the laser on-time. The resulting signal is then converted into a digital signal using an analog-to-digital converter 58. A sample clock 59 is provided to the sample and hold circuit 56 and the analog-to-digital converter 58 so that the readings are taken at the appropriate time during a laser pulse.

The digital output of converter 58 is then applied to a processor 60, which can be a personal computer, programmed by software 61 to correlate the digital signals representing light intensity to control signals used to control the laser 12 itself. Processor 60 can also be a hard-wired ASIC. Analog signals from photodetector 46 in the laser system 10 are processed by an identical sample and hold circuit 62 and analog-to-digital converter 64 and applied to processor 60.

A laser controller 14 receives the control signals from processor 60 and adjusts the characteristics of laser 12 using known methods. One known method used to adjust the light intensity output of a laser is to adjust the excitation voltage within laser 12. Other techniques for controlling the output of laser 12 include controlling the excitation chamber gas pressure, gas mixture, or gas temperature.

In one embodiment, laser 12 outputs ultra-violet pulses at the rate of 1000 Hz.

As an alternative to controlling laser 12 to increase or decrease its light intensity, the light intensity level detected by photodetectors 44 and 46 may be used by laser controller 14 or pulse controller 27 (FIG. 1) to determine whether more or fewer light pulses are to impinge upon wafer 22 prior to wafer 22 being stepped or during a scan.

FIG. 3 illustrates the basic steps performed by the systems in FIGS. 1 and 2 while the wafer 22 is being processed by stepper 20.

In step 1, laser 12 is energized to output laser beam pulses. In one embodiment, pulses are output at 1000 Hz. A predetermined number (e.g., ten) of pulses at a certain intensity are needed to properly expose the photoresist on the surface of wafer 22.

In step 2, the light intensity output of laser 12 is sensed using photodetector 46. This signal is digitized and applied to processor 60 as shown in FIG. 2.

In step 3, the light intensity output from the stepper/scanner optics is detected using photodetector 44. This signal is then digitized and applied to processor 60 as shown in FIG. 2.

The signals generated using photodetectors 44 and 46 will typically differ in various ways due to different causes. FIG. 4 shows the intensity amplitude of the light pulses output from laser 12 as detected by photodetector 46, prior to correction of the laser 12 output. Pulses are typically output in bursts and, in the particular example of FIG. 4, there are seven pulses per burst. There is a time delay between bursts. Typically, the first few pulses in a burst have a higher amplitude than the remaining pulses in the burst. The first few pulses differ in amplitude while the remaining pulses generally have a constant amplitude. Also seen in FIG. 4, the amplitudes of the pulses in the third burst are higher than the pulse amplitudes in the first two bursts, even though it is desired to have all pulses in all the bursts be of the exact same amplitude. Such differences in amplitudes within the bursts and between bursts are caused by transient conditions within laser 12, such as heat and the excitation phenomenon within the laser chamber. The causes of such transients are well known and need not be described herein in detail.

Generally, the transients in the laser output are repeatable and predictable based upon the past history of the pulse energies. Utilizing this repeatability will be described later.

FIG. 5 illustrates the change in attenuation of the light intensity due to the optics and due to beam angle deviation during the same time period shown in FIG. 4. The change in optics attenuation is generally due to heat fluctuations within the optical components themselves. Generally, as an optical component becomes hotter, its attenuation increases due to various factors. Additionally, during a laser burst, the beam angle may change slightly. This change in beam angle is not sensed by photodetector 46 at the output of laser 12. However, a change in beam angle may result in substantial attenuation of light incident on reticle 36 and photodetector 44 since these components may be tens of meters away from laser 12. Such attenuation due to a change in beam angle is also included in the graph of FIG. 5.

Referring back to FIG. 3, step 4 illustrates that the differences in the intensity signals output by photodetectors 44 and 46 are calculated in order to determine those intensity transients due to the stepper optics or beam angle and those transients due to the laser 12.

In step 5, the transients in the pulse intensity due to laser 12 itself are identified based on the photodetector 46 signals.

In step 6, the transients in the pulse intensity due to the stepper/scanner optics or a beam angle change are identified based on the difference between the photodetector signals.

In step 7, the transients due to the laser itself are recorded and analyzed to determine how these transients repeat from pulse to pulse and from burst to burst.

In step 8, the transients in pulse intensity due to the stepper/scanner optics or beam angle change are recorded and analyzed to determine how these transients repeat from pulse to pulse and from burst to burst.

By separating the transients due to the laser itself from the transients due to the optics or beam angle change, the ability to determine repeated patterns of transients is greatly simplified. Given the complexities of the transients due to the laser 12 itself and due to the stepper/scanner optics, if these transients were combined, the resulting signal may be too complex to even determine whether repeated patterns exist over a reasonable period of time.

In step 9, a repeated pattern of transients due to the laser itself is used to determine a precorrection of the laser output for the next pulse in order to effectively cause the laser output to be uniform from pulse to pulse.

In step 10, it is determined, based upon the results of step 8, the necessary precorrection of the laser output to counteract the transients in the signal received by photodetector 44 solely due to the stepper/scanner optics and beam angle deviation.

In step 11, these precorrections obtained in steps 9 and 10 are merged by processor 60 and applied to the laser controller 14. Laser controller 14 then suitably adjusts the excitation voltage or other characteristics of laser 12, as shown in step 12, in order to cause the pulse intensity, as detected by photodetector 44, to be uniform from pulse to pulse. This correction is done on a pulse by pulse basis such that the light intensity received by photodetector 44 will be uniform from pulse to pulse as illustrated in FIG. 6. The laser 12 output sensed by photodetector 46 will most likely not be uniform from pulse to pulse in order to account for the variation in stepper optics attenuation.

Given this uniform light intensity sensed by photodetector 44 from pulse to pulse, the exposure of wafer 22 to light energy may be made much more predictable. Since fewer pulses per exposure results in less wafer fabrication time, this process may be used to lower the number of pulses per exposure while raising the light intensity per pulse to a uniform level, thus saving processing time.

The above-described invention has particular advantages when a large laser system is provided substantially independently of the stepper or other wafer fabrication equipment. Since, in such a case, one manufacturer develops the laser system and another manufacturer develops the stepper or other processing system. For such wafer fabrication systems, the laser manufacturer need not now take into account the stepper optics losses and, thus, may provide a generic laser system for a number of different stepper systems.

The following papers are incorporated by reference to provide additional detail of a scanning system's optics and methods for dosage control: "Dosage Control for Scanning Exposure with Pulsed Energy Fluctuation and Exposed Position Jitter," by K. Suzuki et al., Jpn. J. Appl. Phys. Vol 34 (1995), pp. 6565–6572, and "Performance of a Step and Scan System for DUV Lithography," by G. deZwart et al., SPIE Symposium on Optical Microlithography, March 1997.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed:

1. A semiconductor wafer fabrication system comprising:
 a wafer exposing system which receives light generated by a laser, said exposing system providing optical elements between said laser and a mask, wherein said optical elements cause said light emitted by said laser to be attenuated prior to impinging upon said mask;

a first light intensity detector positioned within said exposing system so as to receive at least a portion of laser light exiting at least one of said optical elements and prior to said light impinging upon said mask;

a second light intensity detector positioned proximate to said laser so as to receive at least a portion of laser light output from said laser; and a processor connected to receive a first signal relating to an output of said first light intensity detector and a second signal relating to an output of said second light intensity detector, said processor analyzing said first signal and said second signal and controlling an exposure of a semiconductor wafer to laser light based upon a relationship of said first signal to said second signal.

2. The system of claim 1 wherein there are no optical elements provided between said first light intensity detector and said mask.

3. The system of claim 1 wherein optical elements are provided between said first light intensity detector and said mask.

4. The system of claim 3 wherein said laser is an excimer laser in a housing separate from a housing containing said optical elements and said first light intensity detector.

5. The system of claim 3 wherein said laser is a freestanding unit not being supported by said exposing system.

6. The system of claim 1 wherein said exposing system is a stepper.

7. The system of claim 1 wherein said exposing system is a scanner.

8. The system of claim 1 further comprising a laser which emits light of a certain intensity.

9. The system of claim 8 wherein said processor calculates a difference between said output of said first light intensity detector and said output of said second light intensity detctor to determine factors affecting laser light impinging on said semiconductor wafer.

10. The system of claim 9 wherein said factors affecting laser light include changes in said optical elements within said wafer exposing system.

11. The system of claim 10 wherein said factors affecting laser light further include changes in a laser beam angle with respect to said optical elements in said wafer exposing system.

12. The system of claim 9 wherein said processor, after detecting said digitized outputs of said first light intensity detector and said second light intensity detector, performs the method comprising:

identifying transients in pulse intensity due to said laser based on an output of said second light intensity detector;

determining any repeated pattern of transients due to said laser;

determining a first precorrection of laser light output based on a past history of said transients due to said laser;

identifying transients in said pulse intensity due to factors external to said laser based on an output of said first light intensity detector;

determining any repeated pattern of transients due to said factors external to said laser;

determining a second precorrection of said laser light output based on a past history of said transients due to said factors external to said laser;

merging said first precorrection with said second precorrection to obtain a merged precorrection; and applying signals corresponding to said merged precorrection to a laser controller.

13. The system of claim 12 further comprising a laser controller connected to said laser, wherein said laser controller adjusts a laser output based upon said merged precorrection.

14. A method performed by a semiconductor wafer fabrication system, said system comprising a wafer exposing system which receives light generated by a laser, said exposing system providing optical elements between said laser and a mask, wherein said optical elements cause said light emitted by said laser to be attenuated prior to impinging upon said mask; a first light intensity detector positioned within said exposing system so as to receive at least a portion of laser light exiting at least one of said optical elements and prior to said light impinging upon said mask; and a second light intensity detector positioned proximate to said laser so as to receive at least a portion of laser light output from said laser, said method comprising:

calculating a difference between light intensity detected by said first light intensity detector and light intensity detected by said second light intensity detector to determine factors affecting laser light impinging on said mask.

15. The method of claim 14 wherein said difference identifies factors external to said laser affecting said light impinging on said mask.

16. The method of claim 15 wherein said factors external to said laser include changes in said optical elements within said wafer exposing system.

17. The method of claim 16 wherein said factors external to said laser further also include changes in a laser beam angle with respect to said optical elements in said wafer exposing system.

18. The method of claim 14 further comprising:

identifying transients in pulse intensity due to said laser based on an output of said second light intensity detector;

determining any repeated pattern of transients due to said laser;

determining a first precorrection of laser light output based on a past history of said transients due to said laser;

identifying transients in said pulse intensity due to factors external to said laser based on an output of said first light intensity detector;

determining any repeated pattern of transients due to said factors external to said laser;

determining a second precorrection of said laser light output based on a past history of said transients due to said factors external to said laser;

merging said first precorrection with said second precorrection to obtain a merged precorrection; and applying signals corresponding to said merged precorrection to a laser controller.

19. The method of claim 18 further comprising controlling said laser to adjust a laser output based upon said merged precorrection.

20. The method of claim 14 further comprising controlling said laser based upon said difference.

* * * * *